(12) United States Patent
Ohsawa et al.

(10) Patent No.: US 8,194,353 B2
(45) Date of Patent: *Jun. 5, 2012

(54) SUSPENSION BOARD WITH CIRCUIT

(75) Inventors: Tetsuya Ohsawa, Osaka (JP); Toshiki Naito, Osaka (JP)

(73) Assignee: NITTO DENKO Corporation, Osaka (JP)

( * ) Notice: Subject to any disclaimer, the term of this patent is extended or adjusted under 35 U.S.C. 154(b) by 203 days.

This patent is subject to a terminal disclaimer.

(21) Appl. No.: 12/591,102

(22) Filed: Nov. 9, 2009

(65) Prior Publication Data

US 2010/0118445 A1  May 13, 2010

Related U.S. Application Data

(60) Provisional application No. 61/193,382, filed on Nov. 21, 2008.

(30) Foreign Application Priority Data

Nov. 11, 2008  (JP) ................................ 2008-289048

(51) Int. Cl.
*G11B 5/48* (2006.01)
(52) U.S. Cl. .................................................. 360/245.3
(58) Field of Classification Search ............... 360/245.3, 360/245.4, 245.7, 245.9, 245
See application file for complete search history.

(56) References Cited

U.S. PATENT DOCUMENTS

| | | | | |
|---|---|---|---|---|
| 6,110,330 A | * | 8/2000 | Lin et al. | .................. 204/192.16 |
| 6,139,936 A | * | 10/2000 | Weiss | ............................ 428/141 |
| 6,166,888 A | | 12/2000 | Tsuda et al. | |
| 6,400,529 B1 | | 6/2002 | Baba et al. | |
| 6,459,548 B1 | | 10/2002 | Shiraishi et al. | |
| 2003/0107843 A1 | | 6/2003 | Hanya et al. | |
| 2003/0227718 A1 | | 12/2003 | Ishikawa | |
| 2004/0089638 A1 | | 5/2004 | Tanaka | |
| 2005/0045601 A1 | | 3/2005 | Kashima et al. | |
| 2006/0039084 A1 | | 2/2006 | Kashima | |
| 2006/0187564 A1 | | 8/2006 | Sato et al. | |
| 2006/0266471 A1 | | 11/2006 | Tanaka | |
| 2007/0177302 A1 | | 8/2007 | Shimazawa et al. | |
| 2007/0242921 A1 | | 10/2007 | Matsumoto | |
| 2007/0247760 A1 | | 10/2007 | Hanya et al. | |
| 2008/0115962 A1 | | 5/2008 | Juni et al. | |
| 2008/0130155 A1 | | 6/2008 | Naniwa et al. | |

(Continued)

FOREIGN PATENT DOCUMENTS

JP   07-078436   3/1995

(Continued)

*Primary Examiner* — Allen Cao
(74) *Attorney, Agent, or Firm* — Jean C. Edwards, Esq.; Edwards Neils PLLC

(57) ABSTRACT

A suspension board with circuit includes a conductive pattern, a board main body portion, an auxiliary portion folded back with respect to the board main body portion, a slider disposed on a side of the suspension board with circuit which is closer to the board main body portion, and mounting thereon a magnetic head, and a light emitting element disposed on a side of the suspension board with circuit which is closer to the auxiliary portion. The conductive pattern includes a first conductive pattern including first and second terminals connected to an external circuit and the magnetic head, and second conductive pattern including third and fourth terminals connected to the external circuit and light emitting element. Both of the first and second terminal are disposed on the board main body portion. The third and fourth terminals are disposed on the board main body portion and on the auxiliary portion respectively.

6 Claims, 13 Drawing Sheets

U.S. PATENT DOCUMENTS

2010/0188779 A1 * 7/2010 Ohsawa et al. ............ 360/246.1

FOREIGN PATENT DOCUMENTS

| | | |
|---|---|---|
| JP | 10-241133 | 9/1998 |
| JP | 10-293915 | 11/1998 |
| JP | 2000-348451 | 12/2000 |
| JP | 2001-023138 | 1/2001 |
| JP | 2002-216327 | 8/2002 |
| JP | 2003-045004 | 2/2003 |
| JP | 2003-173643 | 6/2003 |
| JP | 2004-154836 | 6/2004 |
| JP | 2005-71465 | 3/2005 |
| JP | 2006-59464 | 3/2006 |
| JP | 2006-185548 | 7/2006 |
| JP | 2007-052918 | 3/2007 |
| JP | 2007-157209 | 6/2007 |
| JP | 2007-207349 | 8/2007 |
| JP | 2007-280572 | 10/2007 |
| JP | 2007-287296 | 11/2007 |
| JP | 2008-034091 | 2/2008 |
| JP | 2008-130106 | 6/2008 |
| JP | 2008-152899 | 7/2008 |
| WO | WO 02/50835 A1 | 6/2002 |

* cited by examiner

FIG. 3
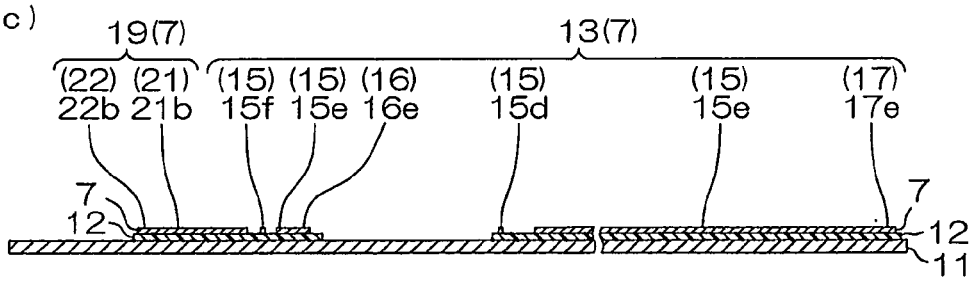
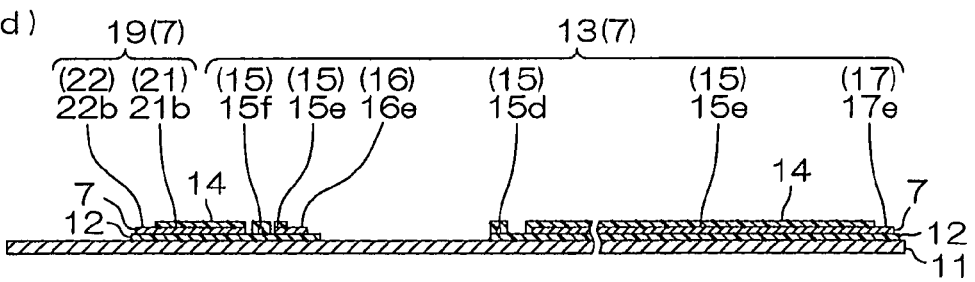
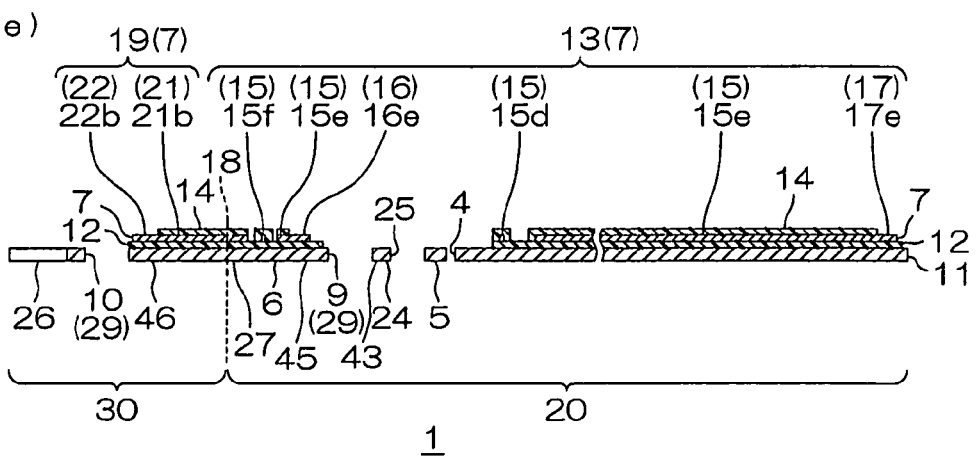

FIG. 13
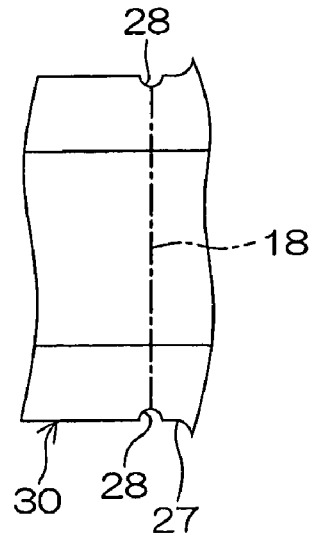
FIG. 14
(a)
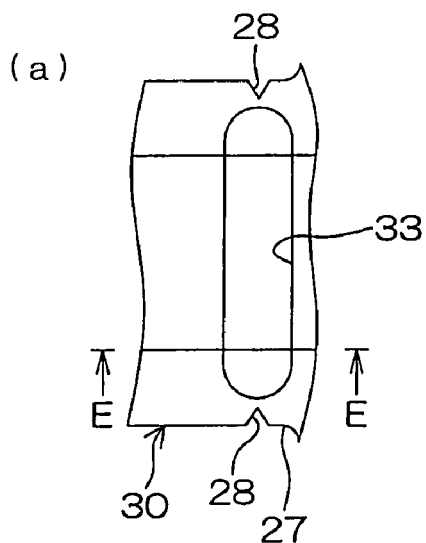
(b)
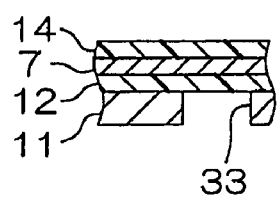

SUSPENSION BOARD WITH CIRCUIT

CROSS-REFERENCE TO RELATED APPLICATION

This patent application claims the benefit of U.S. Provisional Application No. 61/193,382, filed on Nov. 21, 2008, and claims priority from Japanese Patent Application No. 2008-289048, filed on Nov. 11, 2008, the contents of which are herein incorporated by reference in their entirety.

BACKGROUND OF THE INVENTION

1. Field of the Invention

The present invention relates to a suspension board with circuit and, more particularly, to a suspension board with circuit used in a hard disk drive in which an optically assisted method is employed.

2. Description of the Related Art

In recent years, it has been known to use a suspension board with circuit in a hard disk drive in which an optically assisted method is employed. The optically assisted method is a recording method in which, when information is to be recorded, light is emitted from a light emitting element toward a magnetic disk to irradiate and heat the magnetic disk, and the information is recorded by a magnetic head on the magnetic disk having a reduced coersive force as a result of being irradiated and heated with the light. Because the optically assisted method enables high-density recording of information with a small recording magnetic field, the development thereof has been advanced in recent years.

In an attempt to employ such an optically assisted method, there has been proposed a suspension board with circuit which includes, e.g., a metal supporting board, a light emitting element mounted on a surface (upper surface) of the metal supporting board, and a slider (see, e.g., Japanese Unexamined Patent No. 2008-152899). The suspension board with circuit proposed in Japanese Unexamined Patent No. 2008-152899 further includes a terminal portion (element-side terminal portion) of a supply wire electrically connected to the light emitting element, and a head-side connection terminal portion electrically connected to a magnetic head mounted on the slider. The element-side terminal portion and the head-side connection terminal portion are formed on the same surface of the metal supporting board.

SUMMARY OF THE INVENTION

However, according to Japanese Unexamined Patent No. 2008-152899, both of the light emitting element and the slider are mounted on the same surface of the metal supporting board, so that the element-side terminal portion and the head-side connection terminal portion are also formed on the same surface of the metal supporting board. As a result, the element-side terminal portion and the head-side connection terminal portion should be arranged at a high density, leading to a problem that a short circuit easily occurs therebetween.

When the short circuit is to be prevented, it is necessary to ensure a large space for the disposition of the element-side terminal portion and the head-side connection terminal portion. However, this results in a problem that the suspension board with circuit cannot be compactly mounted in a hard disk drive.

There is also a problem that, since the light emitting element and the slider are both mounted on the same surface of the metal supporting board, a restriction associated with layout design arises.

It is therefore an object of the present invention to provide a suspension board with circuit employing an optically assisted method which can be compactized, while allowing individual types of terminals to be arranged at low densities.

A suspension board with circuit of the present invention includes a conductive pattern, a board main body portion, an auxiliary portion formed continuously from the board main body portion, and folded back with respect to the board main body portion so as to face a back surface of the board main body portion, a slider disposed on a side of the suspension board with circuit which is closer to the board main body portion in a direction in which the board main body portion and the auxiliary portion face each other, and mounting thereon a magnetic head electrically connected to the conductive pattern, and a light emitting element disposed on a side of the suspension board with circuit which is closer to the auxiliary portion in the direction in which the board main body portion and the auxiliary portion face each other, and electrically connected to the conductive pattern, wherein the conductive pattern includes a first conductive pattern including a first terminal electrically connected to an external circuit, and a second terminal electrically connected to the magnetic head, and a second conductive pattern including a third terminal electrically connected to the external circuit, and a fourth terminal electrically connected to the light emitting element, wherein, in the first conductive pattern, both of the first terminal and the second terminal are disposed on the board main body portion, and, in the second conductive pattern, the third terminal is disposed on the board main body portion or on the auxiliary portion, and the fourth terminal is disposed on the auxiliary portion.

In the suspension board with circuit of the present invention, it is preferable that the slider and the light emitting element are disposed to face each other in a thickness direction.

In the suspension board with circuit of the present invention, it is preferable that the slider includes an optical waveguide, the light emitting element is disposed on a back surface of the slider so as to face the optical waveguide in a thickness direction, and each of the board main body portion and the auxiliary portion is formed with a first opening extending therethrough in the thickness direction thereof so as to allow the light emitting element to be inserted through the first opening.

In the suspension board with circuit of the present invention, it is preferable that the slider includes an optical waveguide, and each of the board main body portion and the auxiliary portion is formed with a second opening extending therethrough in a thickness direction thereof so as to allow light emitted from the light emitting element to pass through the second opening to be incident upon the optical waveguide.

In the suspension board with circuit of the present invention, it is preferable that the board main body portion is formed with a third opening extending therethrough in a thickness direction, and the auxiliary portion includes an insertion portion to be inserted into the third opening.

In the suspension board with circuit of the present invention, it is preferable that the board main body portion and the auxiliary portion are joined together by welding.

In the suspension board with circuit of the present invention, each of the first terminal, the second terminal, and the third terminal is disposed on the board main body portion, while the fourth terminal is disposed on the auxiliary portion. Alternatively, both of the first terminal and the second terminal are disposed on the board main body portion, while both of the third terminal and the fourth terminal are disposed on the auxiliary portion.

That is, the fourth terminal is disposed on the auxiliary portion different from the board main body portion on which the first terminal, the second terminal, and the third terminal are disposed. Alternatively, the third terminal and the fourth terminal are disposed on the auxiliary portion different from the board main body portion on which the first terminal and the second terminal are disposed.

This allows the individual types of terminals to be separately formed at low arrangement densities on the board main body portion and on the auxiliary portion. As a result, it is possible to prevent a short circuit therebetween, and consequently improve the connection reliability of the conductive pattern.

In addition, in the suspension board with circuit, the slider and the light emitting element are located on both sides in the direction in which the board main body portion and the auxiliary portion face each other.

Therefore, by electrically connecting the magnetic head to the second terminal with increased layout design flexibility at the board main body portion, and electrically connecting the light emitting element to the fourth terminal with increased layout design flexibility at the auxiliary portion, the layout design flexibility of each of the slider and the light emitting element can be increased.

BRIEF DESCRIPTION OF THE DRAWINGS

FIG. 3 is a process view for illustrating a producing method of the suspension board with circuit shown in FIG. 2,
  (a) showing the step of preparing a metal supporting board,
  (b) showing the step of forming an insulating base layer,
  (c) showing the step of forming a conductive pattern,
  (d) showing the step of forming an insulating cover layer, and
  (e) showing the step of forming a slit portion, an insertion opening, a main-body-side insertion opening, and an auxiliary-portion-side insertion opening;

FIG. 13 is an enlarged plan view of a fold portion of the suspension board with circuit according to still another embodiment of the present invention prior to the folding-back step; and FIG. 14 is an enlarged view of the fold portion of the suspension board with circuit according to the still another embodiment of the present invention prior to the folding-back step,
  (a) showing a plan view thereof, and
  (b) showing a cross-sectional view along the line E-E of (a).

DETAILED DESCRIPTION OF THE INVENTION

Figure 1:
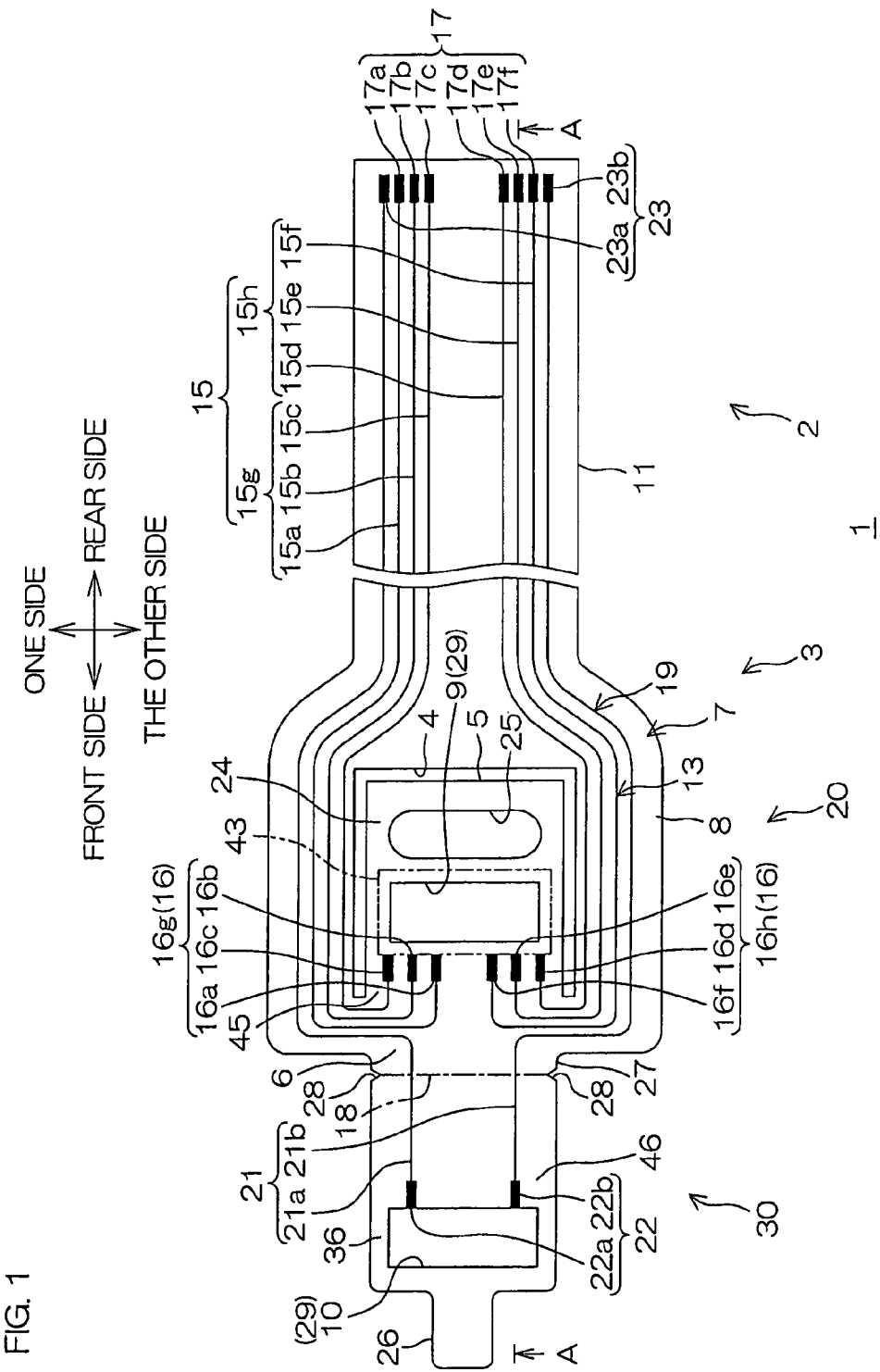
FIG. 1 is a plan view of a suspension board with circuit according to an embodiment of the present invention prior to a folding-back step.
Figure 2:
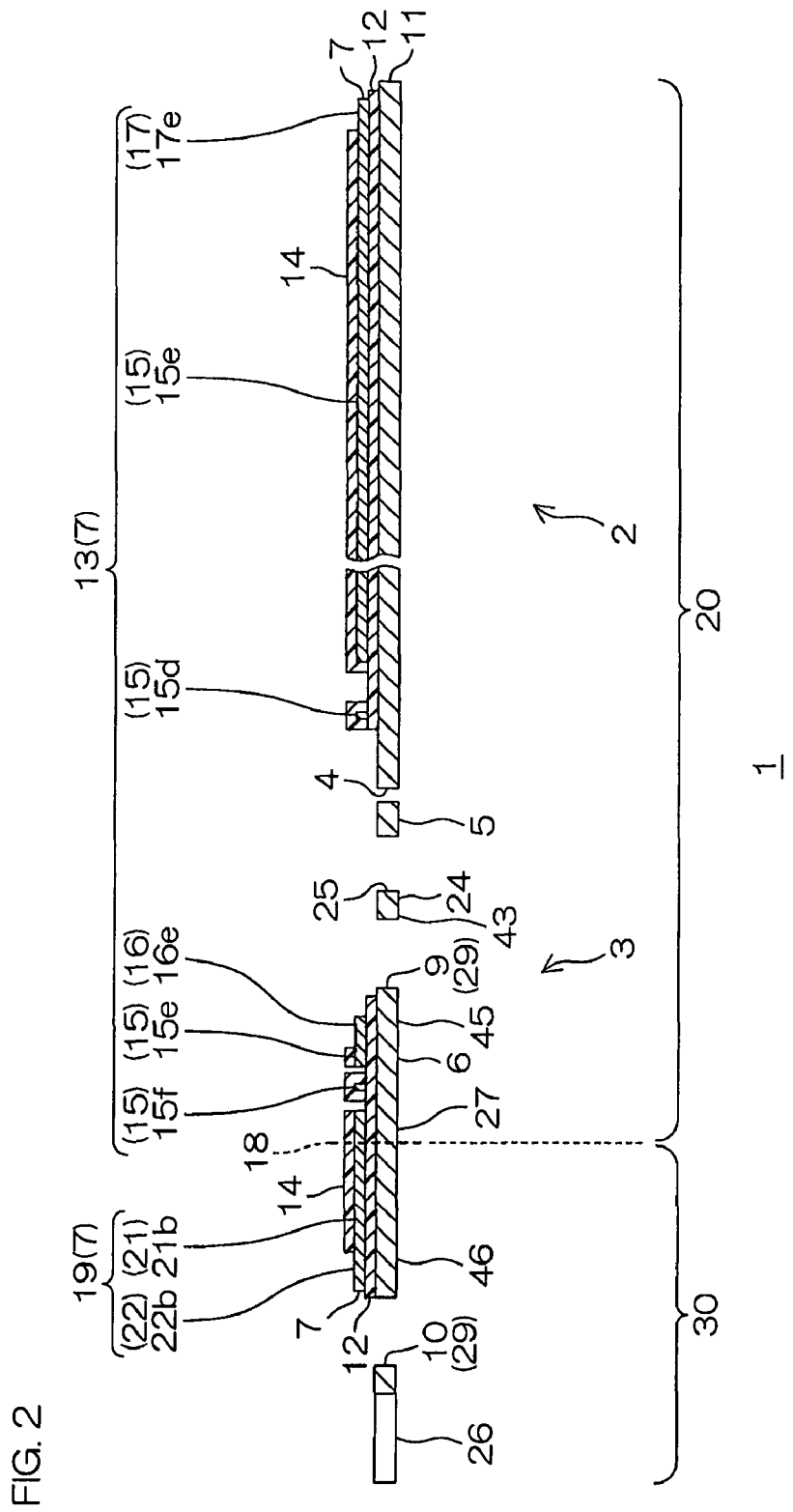
FIG. 2 is a cross-sectional view of the suspension board with circuit shown in FIG. 1 along the line A-A.
Figure 4:
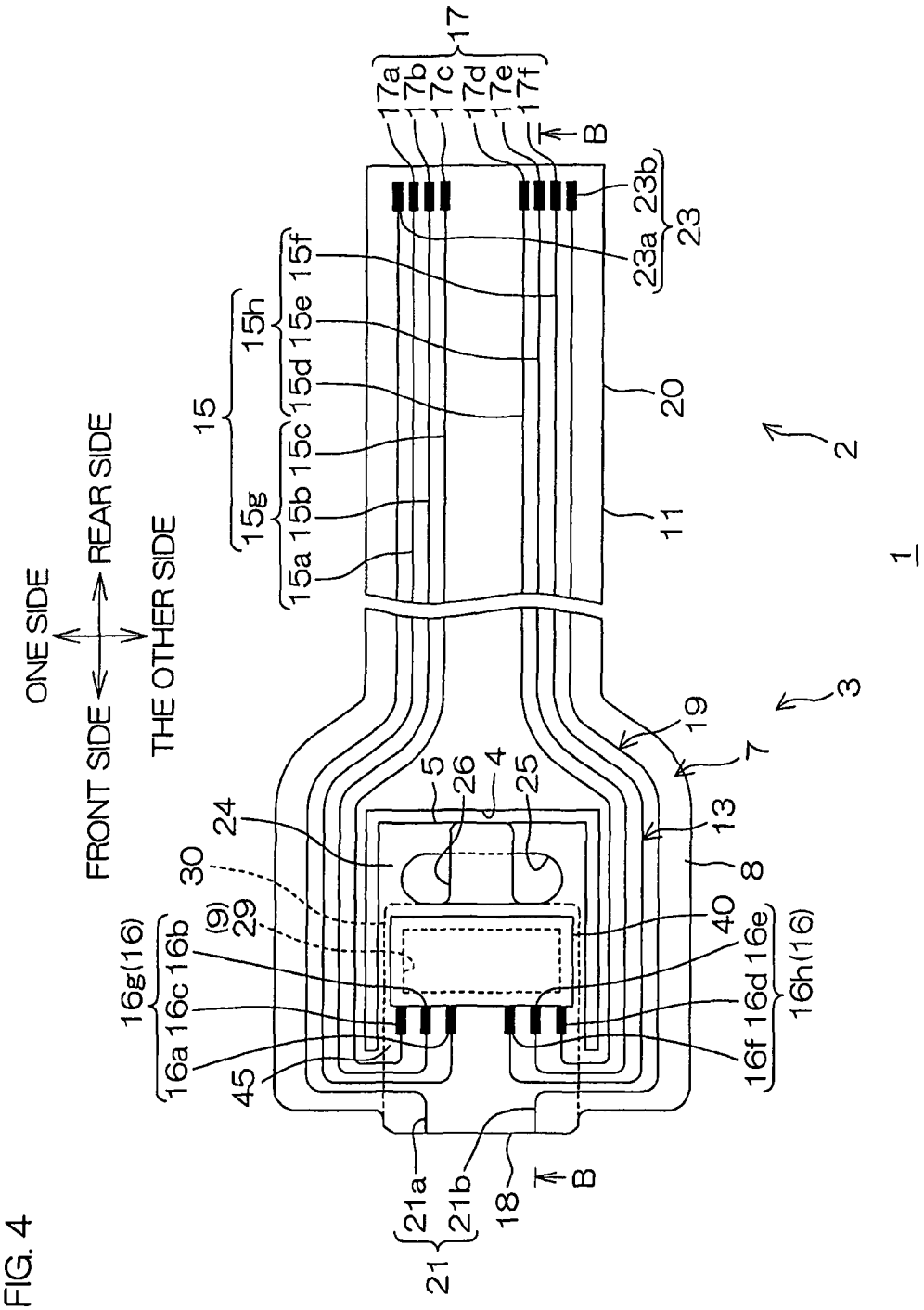
FIG. 4 is a plan view of the suspension board with circuit of FIG. 1 after the folding-back step.
Figure 5:
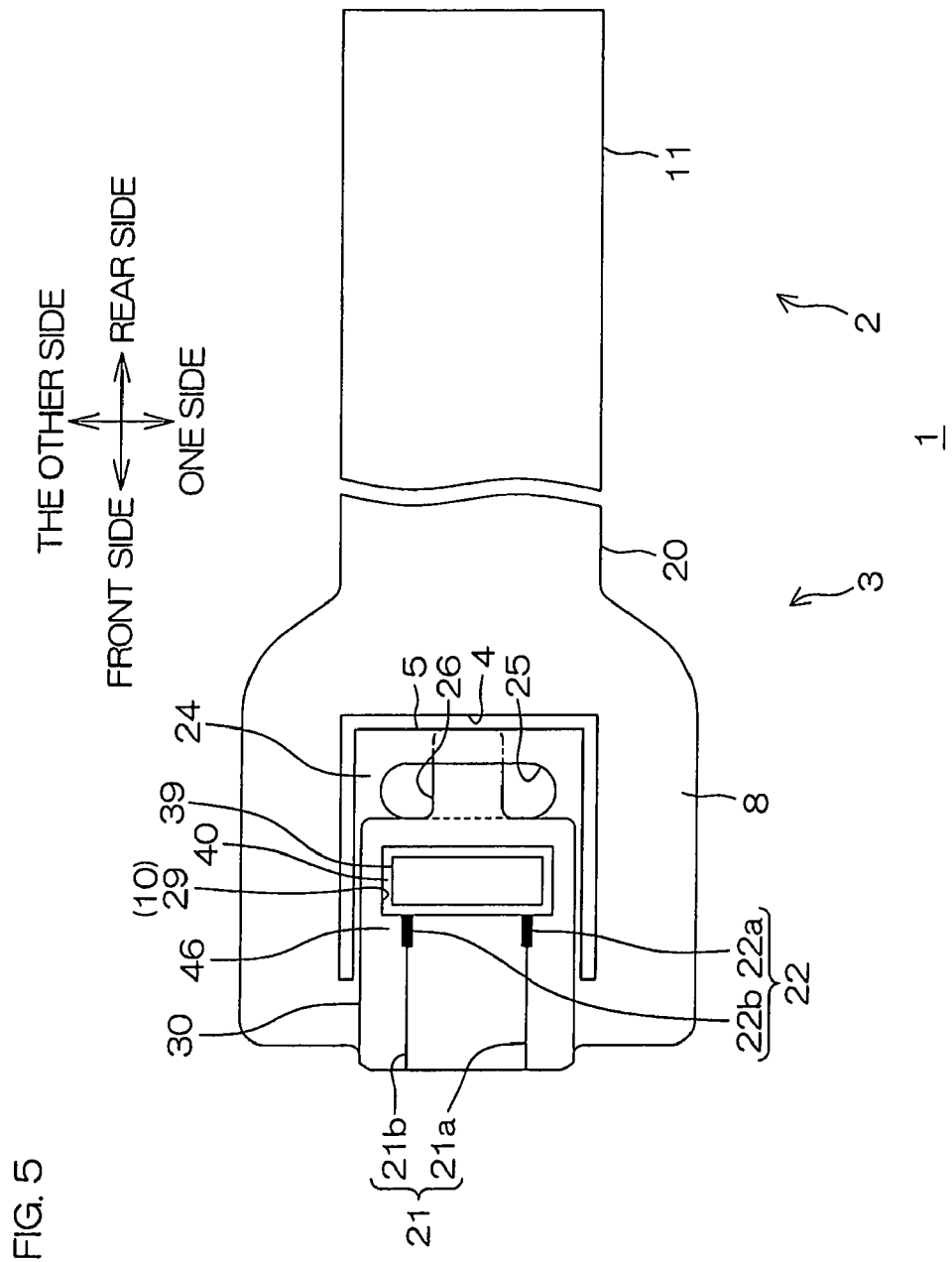
FIG. 5 is a bottom view of the suspension board with circuit of FIG. 4.
Figure 6:
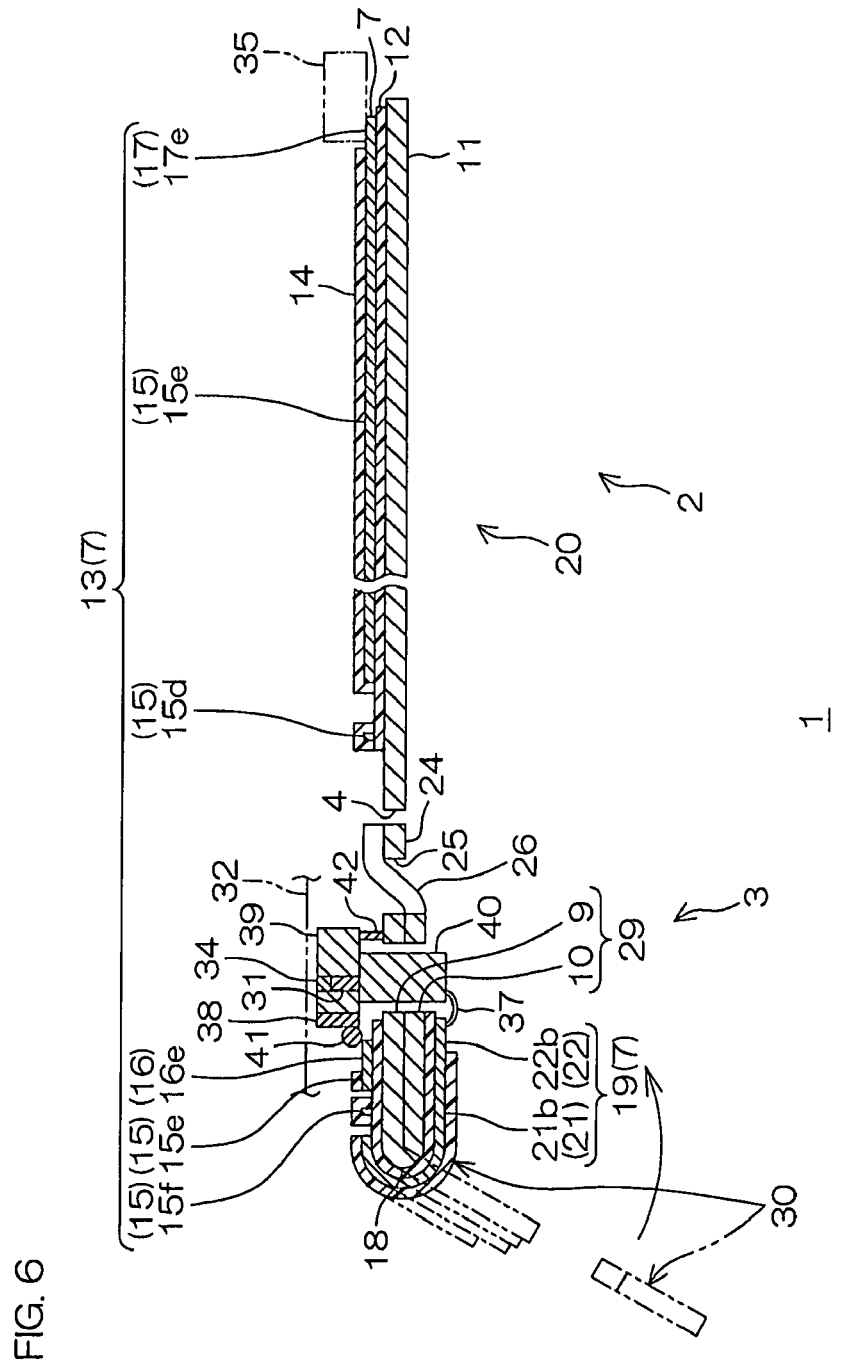
FIG. 6 is a cross-sectional view of the suspension board with circuit of FIG. 4 along the line B-B.

FIG. 1 is a plan view of a suspension board with circuit according to an embodiment of the present invention prior to a folding-back step (described later). FIG. 2 is a cross-sectional view of the suspension board with circuit shown in FIG. 1 along the line A-A. FIG. 3 is a process view for illustrating a producing method of the suspension board with circuit shown in FIG. 2. FIGS. 4 to 6 show the suspension board with circuit of FIG. 1 after the folding-back step, in which FIG. 4 is a plan view thereof, FIG. 5 is a bottom view thereof, and FIG. 6 is a cross-sectional view thereof along the line B-B of FIG. 4.

In FIGS. 1, 4, and 5, an insulating base layer 12 and an insulating cover layer 14, each described later, are omitted for clear illustration of relative positioning of a conductive pattern 7 described later.

In FIGS. 4 to 6, a suspension board with circuit 1 has an auxiliary portion 30 described later, which is folded back. As shown in FIG. 1, a slider 39 for mounting thereon a magnetic head 38 described later, and a light emitting element 40 are mounted on the suspension board with circuit 1, and the suspension board with circuit 1 is used in a hard disk drive employing an optically assisted method.

First, the suspension board with circuit 1 before the auxiliary portion 30 is folded back is described in detail with reference to FIGS. 1 and 2.

In the suspension board with circuit 1, the conductive pattern 7 is supported on a metal supporting board 11.

The metal supporting board 11 is formed in a flat belt shape extending in a longitudinal direction, and integrally includes a board main body portion 20, and the auxiliary portion 30.

The board main body portion 20 is formed in a flat belt shape extending in the longitudinal direction, and integrally includes a wiring portion 2 disposed on one longitudinal side (hereinafter referred to as a rear side), and a mounting portion 3 disposed on the other longitudinal side (hereinafter referred to as a front side) of the wiring portion 2.

The wiring portion 2 is formed in a generally rectangular plan view shape extending in the longitudinal direction. The wiring portion 2 is defined in the board main body portion 20 as a region which is mounted and supported with a back surface (lower surface) thereof facing downward on a load beam not shown.

The mounting portion 3 is defined in the board main body portion 20 as a region exposed from the load beam, together with the auxiliary portion 30 described next, without being mounted on the load beam when the wiring portion 2 is mounted on the load beam. Specifically, the mounting portion 3 is formed as one longitudinal end portion (front end portion) of the board main body portion 20 on which the slider 39 (the magnetic head 38 mounted thereon) is mounted.

Specifically, the mounting portion 3 is formed continuously from the front end of the wiring portion 2 into a generally rectangular plan view shape which protrudes on both outsides of the wiring portion 2 in a widthwise direction (direction perpendicular to the longitudinal direction).

The mounting portion 3 has a slit portion 4 formed in a generally U-shaped shape which opens toward the front side when viewed in plan view. The mounting portion 3 is partitioned into a gimbal portion 5 widthwise interposed in the slit portion 4, outrigger portions 8 disposed on both outsides of the slit portion 4 in the widthwise direction, and a wire turn-back portion 6 disposed on the front side of the gimbal portion 5 and the outrigger portions 8.

The gimbal portion 5 is for imparting flexibility to the operation of the slider 39 (see FIG. 6), disposed at the center of the mounting portion 3 in the both widthwise and front-to-rear directions, and formed in a generally rectangular plan view shape. The gimbal portion 5 is partitioned into a slider mounting region 43, a head-side-terminal formation portion 45, and a main-body-side opening formation portion 24.

The slider mounting region 43 is for mounting the slider 39 (slider 39 for mounting thereon the magnetic head 38) on the surface (upper surface) thereof, disposed at the longitudinal center of the gimbal portion 5, and defined in a generally rectangular plan view shape elongated in the widthwise direction.

The slider mounting region 43 has a main-body-side insertion opening 9 formed to extend through the suspension board with circuit 1 in a thickness direction (which is the thickness direction of the board main body portion 20 and the auxiliary portion 30 after the auxiliary portion 30 is folded back, as shown in FIG. 6).

The main-body-side insertion opening 9 is bored to be smaller than the slider 39 (see FIG. 6), and larger than the light-emitting element 40 when viewed in plan view, and formed in a generally rectangular plan view shape elongated in the widthwise direction. More specifically, the main-body-side insertion opening 9 is formed at the center of the slider mounting region 43 in the both longitudinal and widthwise directions.

Note that, when the auxiliary portion 30 is folded back, the main-body-side insertion opening 9 cooperates with an auxiliary-portion-side insertion opening 10 described later to form an insertion opening 29 as a first opening. As shown in FIG. 6, the light emitting element 40 is inserted through the insertion opening 29.

The head-side-terminal formation portion 45 is a region on the surface (upper surface) of which head-side terminals 16 are formed, and disposed on the front side of the slider mounting region 43. The head-side-terminal formation portion 45 is defined so as to extend in the widthwise direction.

The main-body-side opening formation portion 24 is a region defined on the rear side of the slider mounting region 43, and has an insertion opening 25 formed as a third opening extending through the board main body portion 20 in the thickness direction thereof.

The insertion opening 25 is formed in a long hole shape elongated in the widthwise direction. As shown in FIG. 6, when the auxiliary portion 30 described later is folded back, an insertion portion 26 is inserted into the insertion opening 25.

The wire turn-back portion 6 is defined in a generally rectangular plan view shape elongated in the widthwise direction. On the front side of the wire turn-back portion 6, there is provided a protruding portion 27 which has the widthwise center portion thereof slightly protruding toward the front side.

The protruding portion 27 is formed in a generally rectangular plan view shape having a width slightly smaller than or equal to the width (widthwise length) of the gimbal portion 5, and defined as a region through which power source wires 21 described later pass.

The auxiliary portion 30 is formed continuously from the board main body portion 20. Specifically, the auxiliary portion 30 is formed to extend from the front end of the protruding portion 27 of the wire turn-back portion 6 toward the front side. More specifically, the auxiliary portion 30 is formed in a generally rectangular plan view shape having generally the same width as that of the protruding portion 27.

The auxiliary portion 30 is partitioned into an element-side-terminal formation portion 46 and an auxiliary-portion-side opening formation portion 36.

The element-side-terminal formation portion 46 is a region having element-side terminals 22, described later, formed on the surface (the upper side, or the back surface (lower surface) when the auxiliary portion 30 is folded back, as shown in FIG. 6), and defined at the longitudinal center of the auxiliary portion 30.

The element-side-terminal formation portion 46 is disposed on the front side of the head-side-terminal formation portion 45 to face the head-side-terminal formation portion 45 in spaced-apart relation. As shown in FIG. 6, the element-side-terminal formation portion 46 is disposed to face the head-side-terminal formation portion 45 in the thickness direction when the auxiliary portion 30 is folded back.

The auxiliary-portion-side opening formation portion 36 is a region defined on the front side of the element-side-terminal formation portion 46 in the auxiliary portion 30, and formed with an auxiliary-portion-side insertion opening 10 extending through the auxiliary portion 30 in the thickness direction thereof.

The auxiliary-portion-side insertion opening 10 is formed in a generally rectangular plan view shape elongated in the widthwise direction when viewed in plan view. The auxiliary-portion-side insertion opening 10 is located on the front side of the main-body-side insertion opening 9 to face the main-body-side insertion opening 9 in spaced-apart relation. Specifically, the auxiliary-portion-side insertion opening 10 is formed in a line-symmetric shape with the main-body-side insertion opening 9 described above with respect to a fold portion 18 described later.

On the front side of the auxiliary portion 30, there is provided the insertion portion 26.

The insertion portion 26 is formed so as to protrude from the widthwise center of the front end portion of the auxiliary portion 30 toward the front side. The insertion portion 26 is formed in a generally rectangular plan view shape having a width smaller than or equal to the width of the insertion opening 25 mentioned above. As shown in FIG. 6, the insertion portion 26 is inserted into the insertion opening 25 when the auxiliary portion 30 is folded back.

In the suspension board with circuit 1, the fold portion 18 indicated by the imaginary line is provided on the boundary between the protruding portion 27 of the board main body portion 20 and the auxiliary portion 30.

The fold portion 18 is formed in a linear shape extending along the widthwise direction, and has notched portions 28 formed in the both widthwise end portions thereof. The notched portions 28 are formed by notching, in a widthwise inward direction, the respective both widthwise end portions of the board main body portion 20 and the auxiliary portion 30 into generally triangular plan view shapes.

In this manner, the fold portion 18 is formed as a fragile portion between the board main body portion 20 (protruding portion 27) and the auxiliary portion 30. Therefore, the auxiliary portion 30 can be folded back with respect to the board main body portion 20 such that the surface (back surface) of the fold portion 18 forms a mountain (valley) portion.

The notched portions 28 having the shapes described above can clearly show the position of the fold portion 18, and hence it is possible to easily and reliably perform a folding back step (described later).

As shown in FIGS. 1 and 2, the conductive pattern 7 includes a first conductive pattern 13, and a second conductive pattern 19.

The first conductive pattern 13 is formed on the surface of the metal supporting board 11, and integrally includes external terminals 17 each as a first terminal, the head-side terminals 16 each as a second terminal, and signal wires 15 for connecting the external terminals 17 and the head-side terminals 16.

The plurality of (six) signal wires 15 are provided over the board main body portion 20 along the longitudinal direction, and arranged in parallel to be spaced apart from each other in the widthwise direction.

The plurality of signal wires 15 are formed of a first signal wire 15a, a second signal wire 15b, a third signal wire 15c, a fourth signal wire 15d, a fifth signal wire 15e, and a sixth signal wire 15f. The first signal wire 15a, the second signal wire 15b, the third signal wire 15c, the fourth signal wire 15d, the fifth signal wire 15e, and the sixth signal wire 15f are arranged in this order from one widthwise side toward the other widthwise side.

At the mounting portion 3, the first signal wire 15a, the second signal wire 15b, and the third signal wire 15c (one-side signal wires 15g) are formed and disposed to extend over and along the outrigger portion 8 on one widthwise side. On the other hand, the fourth signal wire 15d, the fifth signal wire 15e, and the sixth signal wire 15f (other-side signal wires 15h) are disposed to extend over and along the outrigger portion 8 on the other widthwise side.

The first signal wire 15a, the second signal wire 15b, the third signal wire 15c, the fourth signal wire 15d, the fifth signal wire 15e, and the sixth signal wire 15f are disposed to turn back at the wire turn-back portion 6, and reach the head-side-terminal formation portion 45. Specifically, the individual signal wires 15 are disposed to extend along the outrigger portions 8 till reaching the front end portions thereof on both widthwise outsides of the wire turn-back portion 6, where they bend to extend in the widthwise inward direction at the wire turn-back portion 6. Thereafter, the signal wires 15 further turn back toward the rear side to extend from the rear end of the wire turn-back portion 6 toward the rear side, and reach the front end portions of the head-side terminals 16 of the head-side-terminal formation portion 45.

Of the signal wires 15, the outermost first signal wire 15a and the outermost sixth signal wire 15f are formed apart from the outer end edges of the metal supporting board 11 with spaces where the power source wires 21 described later are formed being interposed therebetween.

The plurality of (six) external terminals 17 are provided to be disposed on the surface of the rear end portion of the wiring portion 2, and connected to the respective rear end portions of the individual signal wires 15. The external terminals 17 are arranged to be spaced apart from each other in the widthwise direction. The external terminals 17 are formed of a first external terminal 17a, a second external terminal 17b, a third external terminal 17c, a fourth external terminal 17d, a fifth external terminal 17e, and a sixth external terminal 17f which are connected correspondingly to the first signal wire 15a, the second signal wire 15b, the third signal wire 15c, the fourth signal wire 15d, the fifth signal wire 15e, and the sixth signal wire 15f, and arranged in this order from one widthwise side toward the other widthwise side.

The external terminals 17 are electrically connected to an external circuit board 35 as an external circuit, as indicated by the imaginary line of FIG. 6. Examples of the external circuit board 35 that may be used in a read/write board.

The head-side terminals 16 are disposed on the surface of the mounting portion 3. More specifically, the head-side terminals 16 are disposed at the head-side-terminal formation portion 45 of the gimbal portion 5. The plurality of (six) head-side terminals 16 are provided so as to be connected to the respective front end portions of the individual signal wires 15.

More specifically, the head-side terminals 16 are arranged along the rear end edge (front end edge of the slider mounting region 43) of the head-side-terminal formation portion 45 to be spaced apart from each other in the widthwise direction.

The plurality of head-side terminals 16 are formed of a first head-side terminal 16a, a second head-side terminal 16b, a third head-side terminal 16c, a fourth head-side terminal 16d, a fifth head-side terminal 16e, and a sixth head-side terminal 16f. The third head-side terminal 16c, the second head-side terminal 16b, and the first head-side terminal 16a (one-side head-side terminals 16g) which are connected correspondingly to the third signal wire 15c, the second signal wire 15b, and the first signal wire 15a (the one-side signal wires 15g), and the sixth head-side terminal 16f, the fifth head-side terminal 16e, and the fourth head-side terminal 16d (other-side head-side terminals 16h) which are connected correspondingly to the sixth signal wire 15f, the fifth signal wire 15e, and the fourth signal wire 15d (the other-side signal wires 15h) are arranged in this order from one widthwise side toward the other widthwise side.

Each of the head-side terminals 16 is electrically connected to the magnetic head 38 via a solder ball 41.

In the first conductive pattern 13, a write signal transmitted from the external circuit board 35 is inputted to the magnetic head 38 of the slider 39 via the external terminals 17, the signal wires 15, and the head-side terminals 16, while a read signal read with the magnetic head 38 is inputted to the external circuit board 35 via the head-side terminals 16, the signal wires 15, and the external terminals 17.

The second conductive pattern 19 is formed on the surface of the metal supporting board 11, and integrally includes supply-side terminals 23 each as a third terminal, element-side terminals 22 each as a fourth terminal, and the power source wires 21 for connecting the supply-side terminals 23 and the element-side terminals 22.

The plurality of (two) power source wires 21 are provided along the longitudinal direction to extend over the board main body portion 20 and the auxiliary portion 30, and arranged in parallel to be spaced apart from each other in the widthwise direction.

The plurality of power source wires 21 are formed of a first power source wire 21a and a second power source wire 21b. The first power source wire 21a is disposed on one widthwise side, and the second power source wire 21b is disposed on the other widthwise side.

In the board main body portion 20, the first power source wire 21a and the second power source wire 21b are arranged apart from each other with a space where the signal wires 15 are formed being widthwise interposed therebetween. That is, in the board main body portion 20, the first power source wire 21a is disposed on one widthwise side (outside) of the first signal wire 15a. Also, in the board main body portion 20, the second power-source wire 21b is disposed on the other widthwise side (outside) of the sixth signal wire 15f.

Specifically, the first power source wire 21a is disposed on one widthwise side of the first signal wire 15a in spaced-apart relation at the outrigger portion 8, and disposed on the front side of the first signal wire 15a in spaced-apart relation at the wire turn-back portion 6. On the other hand, the second power source wire 21b is disposed on the other widthwise side of the sixth signal wire 15f in spaced-apart relation at the outrigger portion 8, and disposed on the front side of the sixth signal wire 15f in spaced-apart relation at the wire turn-back portion 6.

More specifically, the first power source wire 21a is disposed to extend along the first signal wire 15a at the outrigger portion 8 till reaching the wire turn-back portion 6, where it bends and extends toward the other widthwise side (inwardly). After bending toward the front side at the widthwise center of the wire turn-back portion 6, the first power source wire 21a successively passes through the protruding portion 27 and the fold portion 18 to reach the element-side-terminal formation portion 46 of the auxiliary portion 30.

The second power source wire 21b is disposed to extend along the sixth signal wire 15f at the outrigger portion 8 till reaching the wire turn-back portion 6, where it bends and extends toward one widthwise side (inwardly). After bending toward the front side at the widthwise center of the wire turn-back portion 6, the second power source wire 21b successively passes through the protruding portion 27 and the fold portion 18 to reach the element-side-terminal formation portion 46 of the auxiliary portion 30.

The plurality of (two) supply-side terminals 23 are provided to be disposed on the surface of the rear end portion of the wiring portion 2, and connected to the respective rear end portions of the individual power source wires 21. The supply-side terminals 23 are formed of a first supply-side terminal 23a and a second supply-side terminal 23b which are connected correspondingly to the first power source wire 21a and the second power source wire 21b. The first supply-side terminal 23a is disposed on one widthwise side, and the second supply-side terminal 23b is disposed on the other widthwise side.

The first supply-side terminal 23a and the second supply-side terminal 23b are disposed apart from each other with the space where the external terminals 17 are formed being widthwise interposed therebetween.

Additionally, the supply-side terminals 23 are formed to be disposed at the same positions as those of the external terminals 17 when projected in the widthwise direction. The supply-side terminals 23 are electrically connected to a power source (not shown) as the external circuit.

The element-side terminals 22 are disposed on the surface of the auxiliary portion 30 and, more specifically, disposed on the element-side-terminal formation portion 46. The plurality of (two) element-side terminals 22 are provided so as to be connected to the respective front end portions of the individual power source wires 21.

The element-side terminals 22 are arranged along the front end edge of the element-side-terminal formation portion 46 (the rear end edge of the auxiliary-portion-side insertion opening 10) to be spaced apart from each other in the widthwise direction. The element-side terminals 22 are formed of a first element-side terminal 22a and a second element-side terminal 22b which are connected correspondingly and respectively to the first power source wire 21a and the second power source wire 21b. The first element-side terminal 22a is disposed on one widthwise side, and the second element-side terminal 22b is disposed on the other widthwise side.

The element-side terminals 22 are disposed on the front side of the head-side terminals 16 to face the head-side terminals 16 in spaced-apart relation. As shown in FIG. 6, when the auxiliary portion 30 is folded back, the element-side terminals 22 are positioned slightly rearward of the head-side terminals 16 when projected in the thickness direction.

As shown in FIG. 6, a terminal on the back-side portion (lower end portion) of the light-emitting element 40 is electrically connected to each of the element-side terminals 22 via a wire 37.

In the second conductive pattern 19, electric energy supplied from the power source is supplied to the light emitting element 40 via the supply-side terminals 23, the power source wires 21, and the element-side terminals 22 to cause the light emitting element 40 to emit high-energy light.

As shown in FIG. 2, the suspension board with circuit 1 includes the metal supporting board 11, the insulating base layer 12 formed on the surface of the metal supporting board 11, the conductive pattern 7 formed on the surface of the insulating base layer 12, and the insulating cover layer 14 formed on the surface of the insulating base layer 12 so as to cover the conductive pattern 7.

The metal supporting board 11 is formed of a metal material such as, e.g., stainless steel, a 42-alloy, aluminum, a copper-beryllium alloy, or phosphor bronze. Preferably, the metal supporting board 11 is formed of stainless steel. The thickness of the metal supporting board 11 is in a range of, e.g., 15 to 50 μm, or preferably 20 to 30 μm.

The insulating base layer 12 is formed to correspond to a portion where the conductive pattern 7 is to be formed.

Examples of an insulating material for forming the insulating base layer 12 include synthetic resins such as a polyimide resin, a polyamideimide resin, an acrylic resin, a polyether nitrile resin, a polyether sulfone resin, a polyethylene terephthalate resin, a polyethylene naphthalate resin, and a polyvinyl chloride resin. Preferably, the insulating base layer 12 is formed of a polyimide resin.

The thickness of the insulating base layer 12 is in a range of, e.g., 1 to 35 μm, or preferably 8 to 15 μm.

Examples of a conductive material for forming the conductive pattern 7 include copper, nickel, gold, a solder, and an alloy thereof. Preferably, the conductive pattern 7 is formed of copper.

The thickness of the conductive pattern 7 is in a range of, e.g., 3 to 50 μm, or preferably 5 to 20 μm.

The widths of each of the signal wires 15 and each of the power source wires 21 are in a range of, e.g., 10 to 200 μm, or preferably 20 to 100 μm. The spacing between the individual signal wires 15 is in a range of, e.g., 10 to 1000 μm, or preferably 20 to 100 μm. The spacing between the individual power source wires 21 is in a range of, e.g., 50 to 10000 μm, or preferably 100 to 1000 μm.

The widths of each of the external terminals 17, each of the head-side terminals 16, each of the supply-side terminals 23, and each of the element-side terminals 22 are in a range of, e.g., 20 to 1000 μm, or preferably 30 to 800 μm. The spacing between the individual external terminals 17, the spacing between the individual head-side terminals 16, and the spacing between the individual element-side terminals 22 are in a range of, e.g., 20 to 1000 μm, or preferably 30 to 800 μm. The spacing between the supply-side terminals 23 is in a range of, e.g., 50 to 10000 μm, or preferably 100 to 1000 μm.

The insulating cover layer 14 is disposed to correspond to the portion where the conductive pattern 7 is to be formed. Specifically, the insulating cover layer 14 is formed in a pattern which exposes the external terminals 17 and the head-side terminals 16, and covers the signal wires 15 correspondingly to the first conductive pattern 13. The insulating cover layer 14 is also formed in the pattern which exposes the supply-side terminals 23 (not shown in FIG. 2) and the element-side terminals 22, and covers the power source wires 21 correspondingly to the second conductive pattern 19.

The insulating cover layer 14 is formed of the same insulating material as the insulating material of the insulating base layer 12 mentioned above. The thickness of the insulating cover layer 14 is in a range of, e.g., 1 to 40 μm, or preferably 1 to 10 μm.

Next, a producing method of the suspension board with circuit 1 is described with reference to FIG. 3.

In the method, as shown in FIG. 3(a), the metal supporting board 11 is prepared first.

Next, as shown in FIG. 3(b), a varnish of a photosensitive insulating material is coated on the surface of the metal supporting board 11, dried, exposed to light, developed, and then cured by heating to form the insulating base layer 12 in the foregoing pattern.

Next, as shown in FIG. 3(c), the conductive pattern 7 is formed on the surface of the insulating base layer 12 by an additive method, a subtractive method, or the like.

Next, as shown in FIG. 3(d), a varnish of a photosensitive insulating material is coated on the surface of the insulating base layer 12 so as to cover the conductive pattern 7, dried, exposed to light, developed, and then cured by heating to form the insulating cover layer 14 in the foregoing pattern.

Next, as shown in FIG. 3(e), the slit portion 4, the insertion opening 25, the main-body-side insertion opening 9, and the auxiliary-portion-side insertion opening 10 are formed in the metal supporting board 11. The slit portion 4, the insertion opening 25, the main-body-side insertion opening 9, and the auxiliary-portion-side insertion opening 10 are formed by, e.g., an etching method such as dry etching (e.g., plasma etching) or wet etching (e.g., chemical etching), drilling perforation, laser processing, or the like. Preferably, the slit portion 4, the insertion opening 25, the main-body-side insertion opening 9, and the auxiliary-portion-side insertion opening 10 are formed by wet etching.

Simultaneously with the formation thereof, the metal supporting board 11 is trimmed, whereby the suspension board with circuit 1 integrally including the board main body portion 20 and the auxiliary portion 30 (including the insertion portion 26) is obtained. Note that, in the trimming of the metal supporting board 11, the notched portions 28 and the insertion portion 26 are formed.

Thereafter, as shown in FIGS. 4 to 6, the auxiliary portion 30 of the suspension board with circuit 1 is folded back with respect to the board main body portion 20 so as to face the back surface of the board main body portion 20 (folding-back step).

Specifically, in the folding-back step, the auxiliary portion 30 is folded back with respect to the board main body portion 20 such that the back surface of the metal supporting board 11 of the auxiliary portion 30, and the back surface of the metal supporting board 11 of the board main body portion 20 are arranged adjacent to each other in the thickness direction.

Also, in the folding-back step, the auxiliary portion 30 is folded back such that the surface (back surface) of the fold portion 18 forms a mountain (valley) portion.

Further, in the folding-back step, the insertion portion 26 of the auxiliary portion 30 folded back is upwardly inserted into the insertion opening 25 of the board main body portion 20.

Note that, in the folding-back step, the auxiliary portion 30 is folded back such that the main-body-side insertion opening 9 and the auxiliary-portion-side insertion opening 10 overlap each other in the thickness direction, and the respective inner circumferential surfaces thereof are at the same position when viewed in plan view. In this manner, in the board main body portion 20 and the auxiliary portion 30, the insertion opening 29 is formed as the first opening extending through the board main body portion 20 and the auxiliary portion 30 in the thickness direction thereof.

Next, the portions of the metal supporting board 11 adjacent to each other in the thickness direction (the metal supporting board 11 of the mounting portion 3, and the metal supporting board 11 of the auxiliary portion 30) are joined together by a joining method such as, e.g., welding (joining step). For the welding, spot welting, e.g., is used. Specifically, spot welding described in any one of Japanese Unexamined Patent Nos. 2004-154836, 2003-173643, 2005-071465, and 2006-059464 is used.

Thereafter, in the board main body portion 20 (on the top-surface side of the suspension board with circuit 1), the slider 39 having the light emitting element 40 mounted on the back surface thereof is mounted on the slider mounting region 43 via an adhesive 42 such that the light emitting element 40 is inserted through the insertion opening 29. Specifically, the slider 39 is mounted on the slider mounting region 43 via the adhesive 42 provided around the insertion opening 29 (main-body-side insertion opening 9) so as to cover the insertion opening 29 from thereover. As a result, the light emitting element 40 is inserted through the insertion opening 29.

In this manner, the mounted slider 39 is disposed on the side of the suspension board with circuit 1 which is closer to the board main body portion 20 when viewed in the thickness direction (direction in which the board main body portion 20 and the auxiliary portion 30 face each other).

On the other hand, the light emitting element 40 mounted on the slider 39 is disposed on the side of the suspension board with circuit 1 which is closer to the auxiliary portion 30 when viewed in the thickness direction (direction in which the board main body portion 20 and the auxiliary portion 30 face each other).

Note that, when the suspension board with circuit 1 is used in the hard disk drive, the slider 39 is disposed on the slider mounting region 43 so as to float from a magnetic disk 32 (see the imaginary line of FIG. 6), and travel relatively to the magnetic disk 32 while maintaining an extremely small gap therebetween. As shown in FIG. 6, on the slider 39, there are mounted the magnetic head 38, an optical waveguide 31, and a near-field light generating member 34.

The magnetic head 38 is mounted on a surface of the slider 39, and provided in facing relation to the magnetic disk 32 indicated by the imaginary line of FIG. 6 so as to be capable of performing a read operation and a write operation to the magnetic disk 32.

The optical waveguide 31 is provided for causing light emitted from the light emitting element 40, described next, to be incident upon the near-field light generating member 34, and formed to extend along the thickness direction. On the upper end of the optical waveguide 31, the near-field light generating member 34 is provided.

The near-field light generating member 34 is provided for generating near-field light from the light incident thereon through the optical waveguide 31, and irradiating the magnetic disk 32 with the near-field light to heat an extremely small region of the magnetic disk 32. The near-field light generating member 34 is formed of a metal scatterer, an opening, or the like. For example, a known near-field light generator described in Japanese Unexamined Patent No. 2007-280572, Japanese Unexamined Patent No. 2007-052918, Japanese Unexamined Patent No. 2007-207349, Japanese Unexamined Patent No. 2008-130106, or the like is employed.

The light emitting element 40 is a light source for causing light to be incident upon the optical waveguide 31, e.g., a light source which converts electric energy to optical energy, and emits high-energy light from an emission port.

The light emitting element 40 is mounted on the back surface of the slider 39 so as to be inserted through the insertion opening 29 of the metal supporting board 11. Also, the light emitting element 40 is mounted on the slider 39 such that the emission port thereof faces the optical waveguide 31.

The light emitting element 40 is formed to have a thickness larger than that of the metal supporting board 11. As a result, the lower end portion (back-surface-side end portion) of the light emitting element 40 protrudes further beyond the back surface of the metal supporting board 11.

Thereafter, the magnetic head 38 is electrically connected to each of the head-side terminals 16 via the solder ball 41, and the external circuit board 35 indicated by the imaginary line is connected to each of the external terminals 17. Subsequently, in the auxiliary portion 30 (on the back side of the suspension board with circuit 1), the light emitting element 40 is electrically connected to each of the element-side terminals 22 via the wire 37. On the other hand, in the board main body portion 20, the power source (not shown) is electrically connected to each of the supply-side terminals 23.

In this manner, the suspension board with circuit 1 (the embodiment of the suspension board with circuit of the present invention) on which the slider 39 having the magnetic head 38 and the light emitting element 40 have been mounted can be obtained.

Thereafter, in the hard disk drive, the wiring portion 2 is mounted on the surface of the load beam with the back surface thereof facing downward so as to be supported thereon.

In such a hard disk drive in which the suspension board with circuit 1 is mounted, an optically assisted method can be employed.

Specifically, in such a hard disk drive, the magnetic disk 32 indicated by the imaginary line of FIG. 6 travels relatively to the near-field light generating member 34 and to the magnetic head 38. Light emitted from the light emitting element 40 passes through the optical wave guide 31 to reach the near-field light generating member 34, and near-field light generated by the near-field light generating member 34 is applied to the surface of the magnetic disk 32 facing the near-field light generating member 34 from thereabove. By irradiation with the near-field light from the near-field light generating member 34, the surface of the magnetic disk 32 is heated and, in this state, information is recorded on the magnetic disk 32 with a magnetic field applied from the magnetic head 38. At that time, since the coersive force of the magnetic disk 32 has been reduced, the information can be recorded at a high density on the magnetic disk 32 by the application of a small magnetic field thereto.

In the suspension board with circuit 1, the external terminals 17, the head-side terminals 16, and the supply-side terminals 23 are each disposed on the board main body portion 20, while the element-side terminals 22 are disposed on the auxiliary portion 30.

That is, the element-side terminals 22 are disposed on the auxiliary portion 30 different from the board main body portion 20 on which the external terminals 17, the head-side terminals 16, and the supply-side terminals 23 are disposed.

This allows formation of the external terminals 17, the head-side terminals 16, and the supply-side terminals 23, each described above, at different low arrangement densities on the board main body portion 20, while allowing separate formation of the element-side terminals 22 described above at another different low arrangement density on the auxiliary portion 30. As a result, it is possible to prevent the above-mentioned short circuit between the terminals, and consequently achieve an improvement in the connection reliability of the conductive pattern 7.

In addition, by folding back the auxiliary portion 30 such that it faces the back surface of the board main body portion 20, it is possible to dispose the light emitting element 40 on the auxiliary portion 30 facing the back surface of the board main body portion 20, while allowing the magnetic head 38 to be disposed on the surface of the board main body portion 20. This can achieve compactization of the suspension board with circuit 1.

Moreover, since the light emitting element 40 and the slider 39 are disposed to face each other in the thickness direction, it is possible to dispose the light emitting element 40 in the vicinity of the slider 39, and cause light emitted from the light element 40 to be reliably incident upon the optical waveguide 31 of the slider 39. It is further possible to efficiently implement the optically assisted method with heat generated from the near-field light resulting from the conversion of light through the optical waveguide 31 and with a magnetic field applied from the magnetic head 38.

Furthermore, in the suspension board with circuit 1, the slider 39 and the light emitting element 40 are respectively disposed on the top surface side (side closer to the board main body portion 20) and the back surface side (side closer to the auxiliary portion 30) of the suspension board with circuit 1.

Therefore, by electrically connecting the magnetic head 38 to the head-side terminals 16 with increased layout design flexibility on the top surface side, and electrically connecting the light emitting element 40 to the element-side terminals 22 with increased layout design flexibility on the back surface side, the layout design flexibility of each of the slider 39 and the light emitting element 40 can be increased.

In accordance with the method described above, it is possible to reliably maintain the folded-back state of the auxiliary portion 30 by a simple and easy method of folding back the auxiliary portion 30, and then joining together the auxiliary portion 30 and the board main body portion 20 by welding.

In the description given above, the supply-side terminals 23 are provided on the board main body portion 20. However, it is also possible to, e.g., provide the supply-side terminals 23 on the auxiliary portion 30, though not shown.

In that case, the power source wires 21 are disposed on the auxiliary portion 30.

In such a suspension board with circuit 1, both of the external terminals 17 and the head-side terminals 16 are disposed on the board main body portion 20, while both of the supply-side terminals 23 and the element-side terminals 22 are disposed on the auxiliary portion 30.

That is, the supply-side terminals 23 and the element-side terminals 22 are disposed on the auxiliary portion 30 different from the board main body portion 20 on which the external terminals 17 and the head-side terminals 16 are disposed.

This allows formation of the external terminals 17 and the head-side terminals 16 at different low arrangement densities on the board main body portion 20, while allowing separate formation of the supply-side terminals 23 and the element-side terminals 22 at other different low arrangement densities on the auxiliary portion 30. As a result, it is possible to prevent the above-mentioned short circuit between the terminals, and consequently achieve an improvement in the connection reliability of the conductive pattern 7.

In the description given above, the slider 39 (having the light emitting element 40 mounted thereon) is mounted on the suspension board with circuit 1 after being subjected to the folding-back step and the joining step. However, the order of the individual steps is not limited thereto. For example, it is also possible to first mount the slider 39 on the suspension board with circuit 1 that has not been subjected to the folding-back step and the joining step yet, and then perform the folding-back step and the joining step with respect to the suspension board with circuit 1 having the slider 39 mounted thereon.

Figure 7:
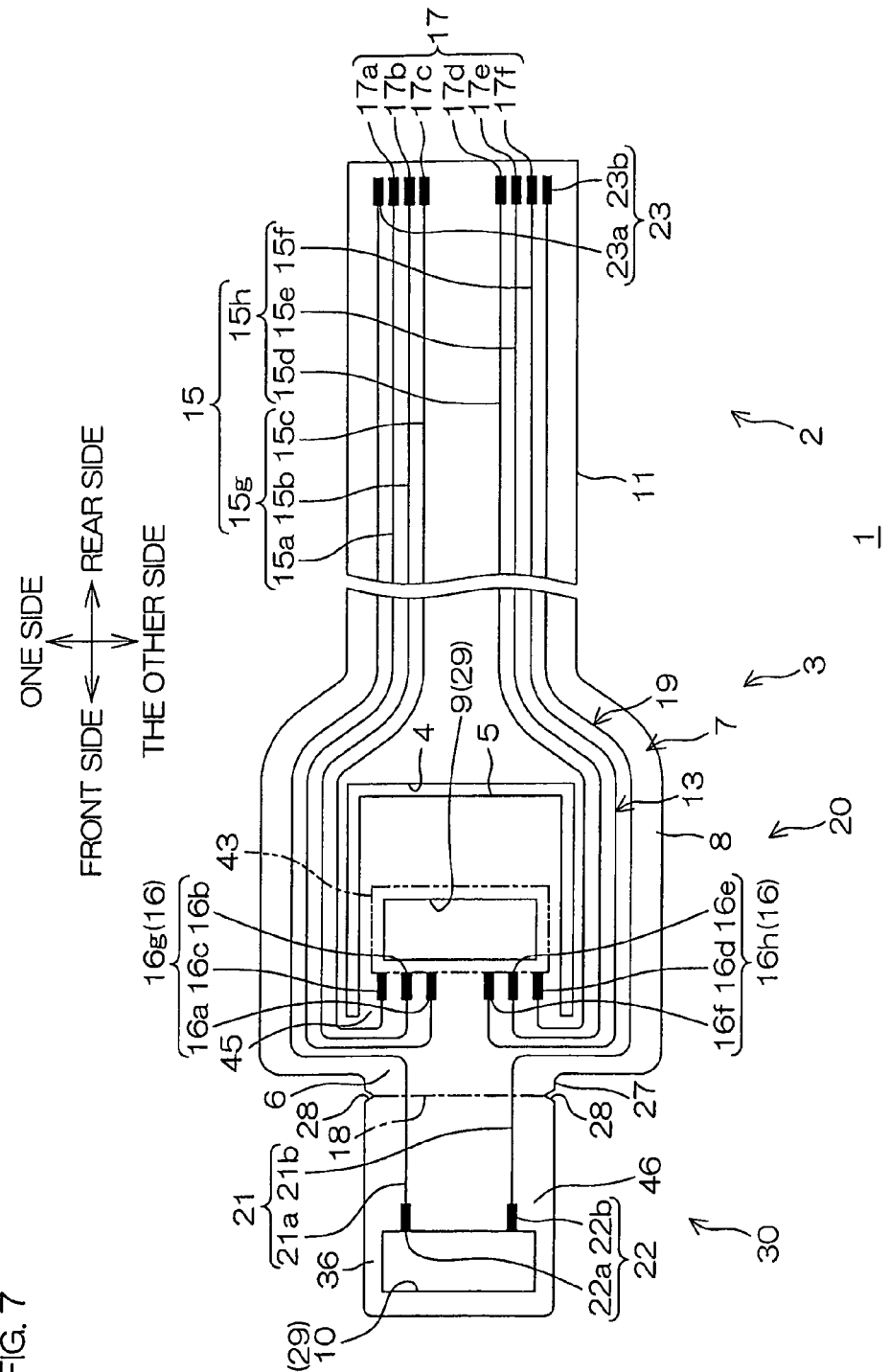
FIG. 7 is a plan view of a suspension board with circuit according to another embodiment of the present invention prior to the folding-back step.

FIG. 7 is a plan view of a suspension board with circuit according to another embodiment of the present invention prior to the folding-back step. The members corresponding to the individual members described above are designated by the same reference numerals in each of the drawings referenced hereinafter, and a detailed description thereof is omitted.

In the description given above, the insertion portion 26 and the insertion opening 25 are formed. However, as shown in FIG. 7, it is also possible to, e.g., fold back the auxiliary portion 30 without forming the insertion portion 26 and the insertion opening 25.

Preferably, the insertion portion 26 and the insertion opening 25 are formed as shown in FIG. 1, the insertion portion 26 is inserted into the insertion opening 25 as shown in FIGS. 4 to 6, while the auxiliary portion 30 is folded back.

By forming the insertion portion 26 and the insertion opening 25 as shown in FIG. 1, and inserting the insertion portion 26 into the insertion opening 25 as shown in FIGS. 4 to 6, it is possible to stabilize the folded-back state of the auxiliary portion 30 after the folding-back step. This allows the auxiliary portion 30 and the board main body portion 20 to be reliably joined together in the joining step after the folding-back step.

Figure 8:
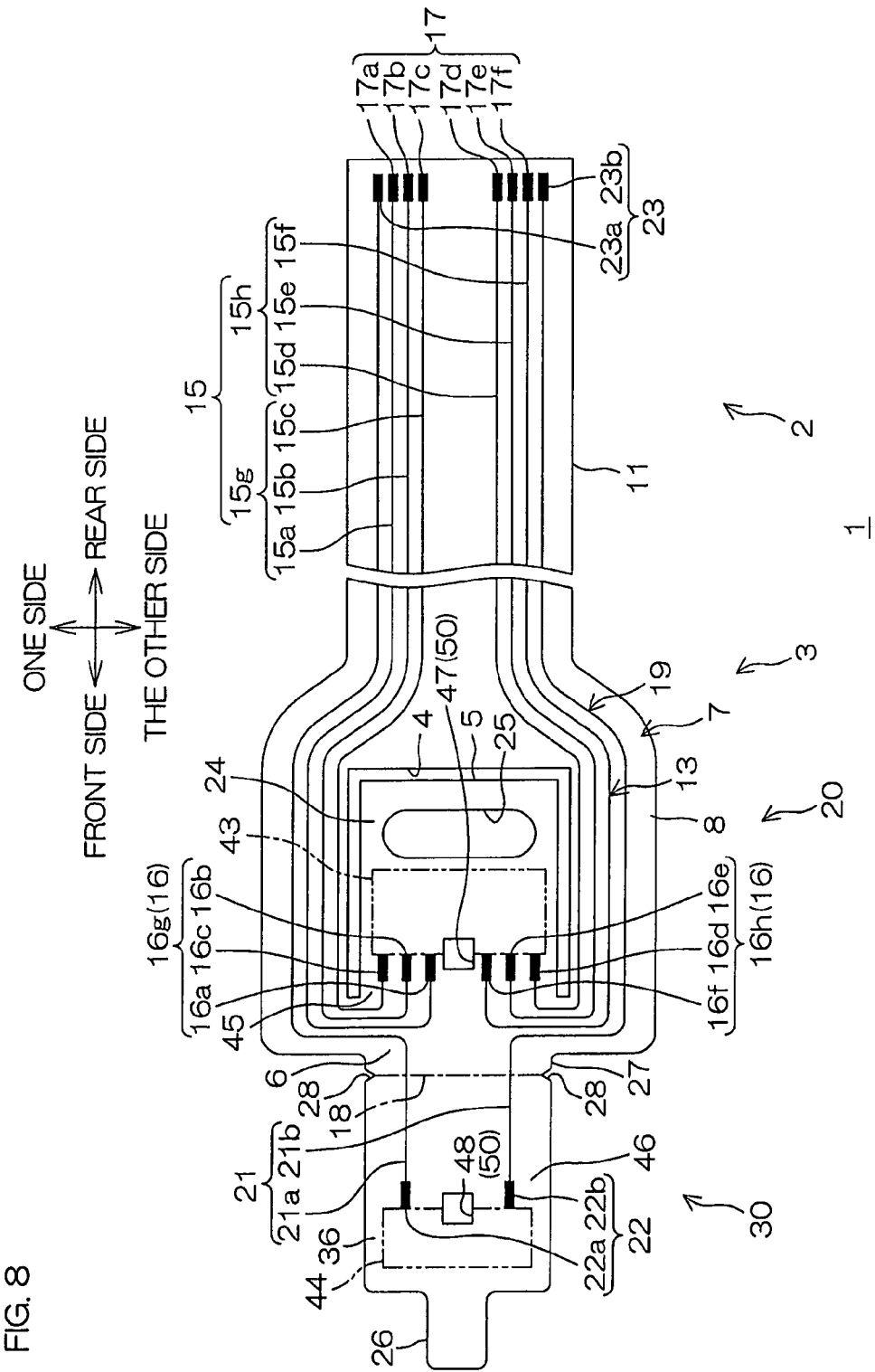
FIG. 8 is a plan view of a suspension board with circuit according to still another embodiment of the present invention prior to the folding-back step.
Figure 9:
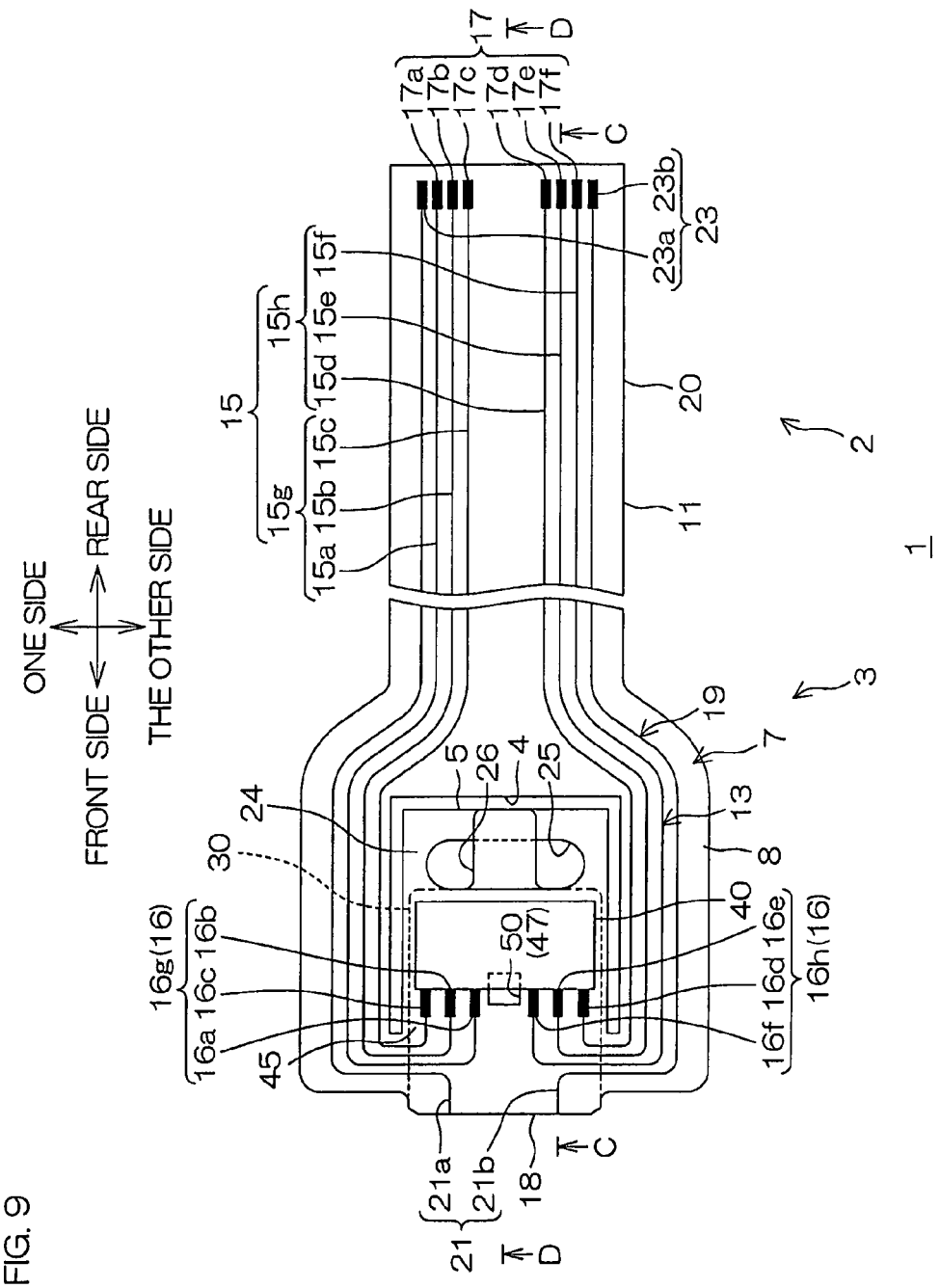
FIG. 9 is a plan view of the suspension board with circuit of FIG. 8 after the folding-back step.
Figure 10:
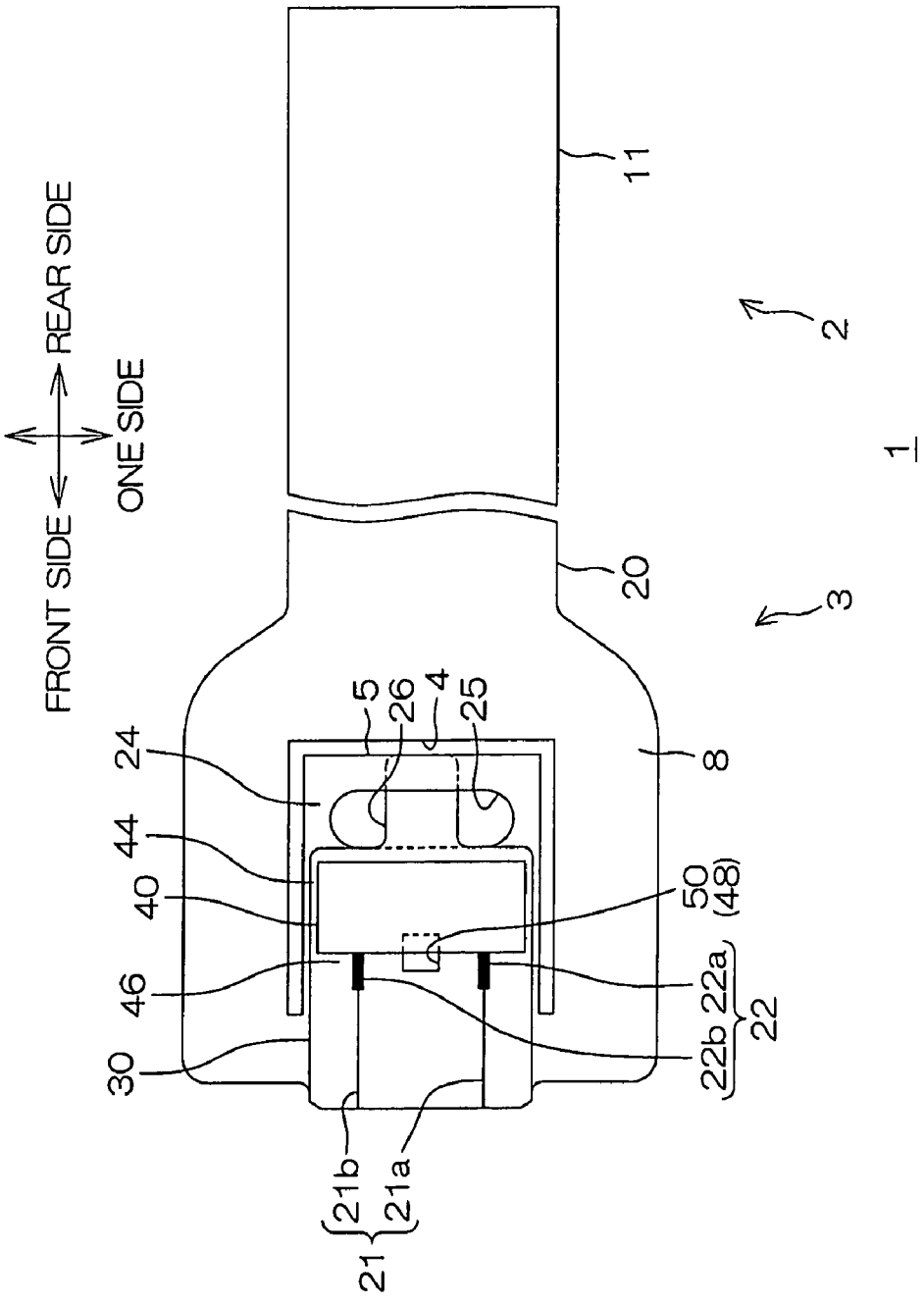
FIG. 10 is a bottom view of the suspension board with circuit of FIG. 9 after the folding-back step.
Figure 11:
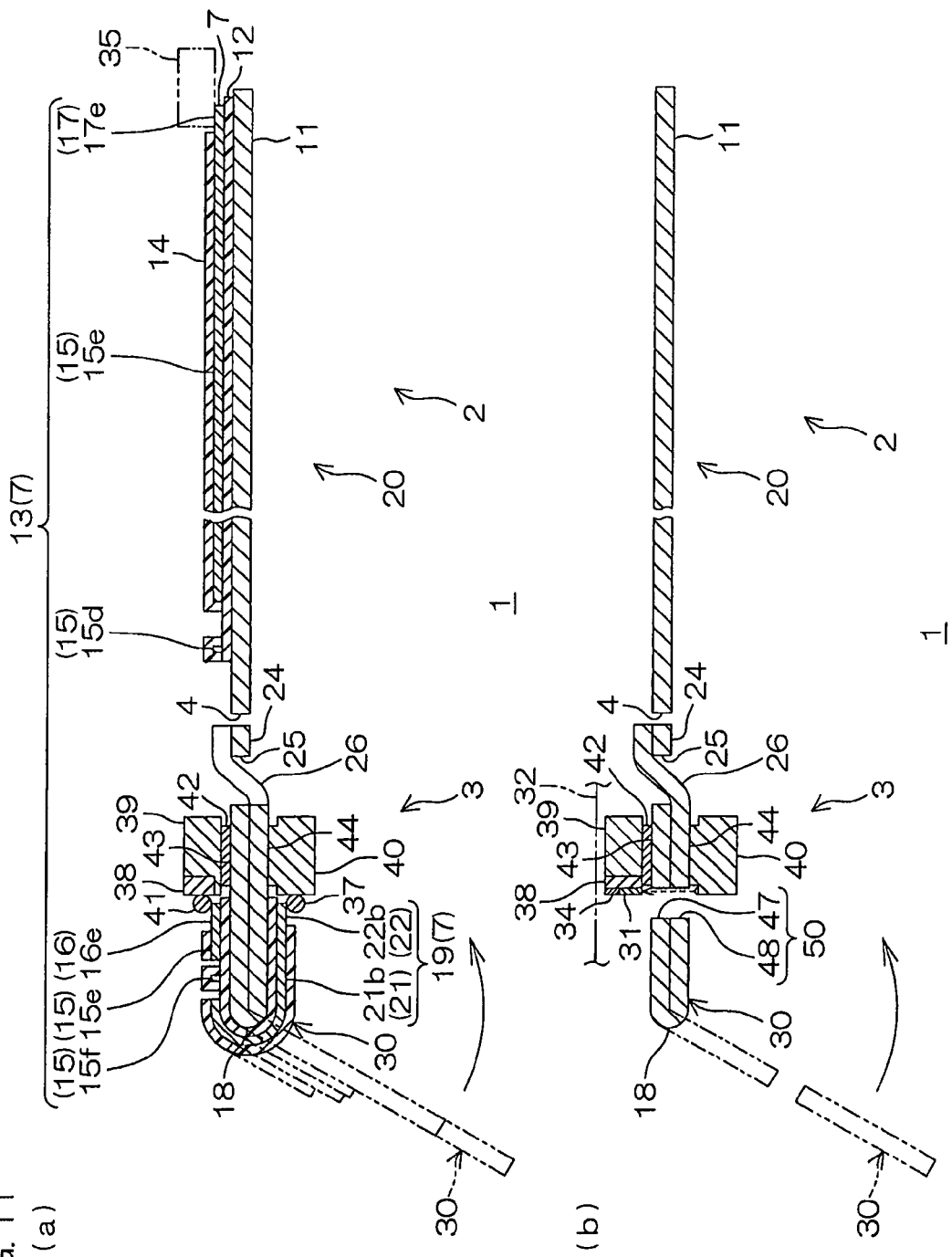
FIG. 11 is a cross-sectional view of the suspension board with circuit of FIG. 9 after the folding-back step,
  (a) showing a cross-sectional view thereof along the line C-C of FIG. 9, and
  (b) showing a cross-sectional view thereof along the line D-D of FIG. 9.

FIG. 8 is a plan view of a suspension board with circuit according to still another embodiment of the present invention prior to the folding-back step. FIGS. 9 to 11 show the suspension board with circuit of FIG. 8 after the folding-back step, in which FIG. 9 is a plan view thereof, FIG. 10 is a bottom view thereof, and FIG. 11 is a cross-section view thereof, (a) showing a cross-sectional view thereof along the line C-C of FIG. 9, and (b) showing a cross-sectional view thereof along the line D-D of FIG. 9.

In the description given above, the light emitting element 40 is directly mounted on the back surface of the slier 39. However, as shown in FIG. 11, it is also possible to, e.g., directly mount the light emitting element 40 on the metal supporting board 11.

In the suspension board with circuit 1, as shown in FIGS. 9 and 10, the insertion opening 29 is not formed and, instead, an emission opening 50 (described later) is formed.

That is, in the suspension board with circuit 1 prior to the folding-back step, the main-body-side insertion opening 9 is not formed, and a main-body-side emission opening 47 is formed, as shown in FIG. 8. On the other hand, in the auxiliary portion 30, the auxiliary-portion-side insertion opening 10 is not formed, and an auxiliary-portion-side emission opening 48 is formed.

After the folding-back step, as shown in FIGS. 9 to 11, the emission opening 50 is formed as a second opening formed of the main-body-side emission opening 47 and the auxiliary-portion-side emission opening 48.

Specifically, as shown in FIG. 8, the main-body-side emission opening 47 is formed in the widthwise center of the gimbal portion 5 of the mounting portion 3 to lie over the front end portion of the slider mounting region 43 and the rear end portion of the head-side-terminal formation portion 45. The main-body-side emission opening 47 is formed in a generally rectangular plan view shape so as to extend through the board main body portion 20 in the thickness direction thereof.

The auxiliary-portion-side emission opening 48 is formed in the auxiliary portion 30 to be located on the front side of the main-body-side emission opening 47 to face the main-body-side emission opening 47 in spaced-apart relation. Specifically, the auxiliary-portion-side emission opening 48 is formed to lie over the front end portion of the element-side-terminal formation portion 46 and the rear end portion of an element mounting region 44 (described later). The auxiliary-portion-side emission opening 48 is formed in a generally rectangular plan view shape so as to extend through the auxiliary portion 30 in the thickness direction thereof. Specifically, the auxiliary-portion-side emission opening 48 is formed in a line-symmetric shape with the main-body-side emission opening 47 with respect to the fold portion 18.

In the auxiliary portion 30, the element mounting region 44 (described later) indicated by the imaginary line 44 is further defined. The element mounting region 44 is a region defined on the front side of the element-side-terminal formation portion 46, and having the surface (the upper surface, or the back surface (lower surface) after the folding-back step, as can be seen from FIG. 11) on which the light emitting element 40 is mounted. The element mounting region 44 is formed at generally the same position as that of the auxiliary-portion-side insertion opening 10 (see FIG. 1) described above, and disposed to face the slider mounting region 43 in the longitudinal direction.

To obtain the suspension board with circuit 1, e.g., the metal supporting board 11 is prepared first, and then a varnish of a photosensitive insulating material is coated on the surface of the metal supporting board 11, dried, exposed to light, developed, and cured by heating to form the insulating base layer 12 in the foregoing pattern, though not shown. Subsequently, the conductive pattern 7 is formed on the surface of the insulating base layer 12 by an additive method, a subtractive method, or the like.

Next, a varnish of a photosensitive insulating material is coated on the surface of the insulating base layer 12 so as to cover the conductive pattern 7, dried, exposed to light, developed, and then cured by heating to form the insulating cover layer 14 in the foregoing pattern.

Next, the slit portion 4, the main-body-side emission opening 47, the auxiliary-portion-side emission opening 48, and the insertion opening 25 are formed in the metal supporting board 11 by the same method as described above, while the metal supporting board 11 is simultaneously trimmed. In this manner, the suspension board with circuit 1 integrally including the board main body portion 20 and the auxiliary portion 30 is obtained.

Thereafter, as shown in FIGS. 9 to 11, a folding-back step and a joining step which are the same as described above are successively performed.

In the folding-back step, the auxiliary portion 30 is folded back such that the main-body-side emission opening 47 and the auxiliary-portion-side emission opening 48 overlap each other in the thickness direction, and the respective inner circumferential surfaces thereof are at the same position when viewed in plan view. In this manner, the emission opening 50 is formed as the second opening extending through the board main body portion 20 and the auxiliary portion 30 in the thickness direction thereof such that light emitted from the light emitting element 40 passes through the emission opening 50 to be incident upon the optical waveguide 31.

In the folding-back step, the element-side terminals 22 and the head-side terminals 16 are disposed to face each other in the thickness direction, and the slider mounting region 43 and the element mounting region 44 are disposed to face each other in the thickness direction.

After the folding-back step and the joining step, in the board main body portion 20 (on the top side of the suspension board with circuit 1), the slider 39 (on which the light emitting element 40 has not been mounted) is mounted on the slider mounting region 43 via the adhesive 42. Subsequently, the magnetic head 38 is electrically connected to each of the head-side terminals 16 via the solder ball 41. Additionally, on the top side of the suspension board with circuit 1, the external circuit board 35 indicated by the imaginary line of FIG. 11(a) is electrically connected to each of the external terminals 17.

On the other hand, in the auxiliary portion 30 (on the back side of the suspension board with circuit 1), the light emitting element 40 is mounted so as to face the slider 39 in the thickness direction. Specifically, the light emitting element 40 is mounted such that the emission port of the light emitting element 40 faces the emission opening 50 and the optical waveguide 31 in the thickness direction. Subsequently, the light emitting element 40 is electrically connected to each of the element-side terminals 22 via the solder ball 41. In addition, on the top side of the suspension board with circuit 1, the power source not shown is electrically connected to each of the supply-side terminals 23.

In this manner, the suspension board with circuit 1 (the still another embodiment of the suspension board with circuit of the present invention) on which the slider 39 having the magnetic head 38 mounted thereon and the light emitting element 40 have been mounted can be obtained.

In the suspension board with circuit 1, light (indicated by the broken line of FIG. 1(b)) emitted from the light emitting element 40 passes through the emission opening 50 to be incident upon the optical waveguide 31, and subsequently reaches the near-field light generating member 34 so that near-field light is generated therefrom by the near-field light generating member 34.

Similarly to the suspension board with circuit 1 shown in FIGS. 1 to 6, the suspension board with circuit 1 shown in FIGS. 8 to 11 can also ensure a low arrangement density to each of the types of terminals, and can simultaneously achieve compactization of the suspension board with circuit 1.

Preferably, as shown in FIGS. 4 to 6, the light emitting element 40 is directly mounted on the back surface of the slider 39.

In contrast to the suspension board with circuit 1 shown in FIG. 11, in the suspension board with circuit 1 shown in FIG. 6, the light emitting element 40 is preliminarily mounted on the slider 39. This can allow an improvement in the accuracy of positioning (optical accuracy) of the light emitting element 40 with respect to the optical waveguide 31.

In addition, since the light emitting element 40 is inserted through the insertion opening 29, the thickness of the suspension board with circuit 1 at the element mounting region 44 can be reduced.

Figure 12:
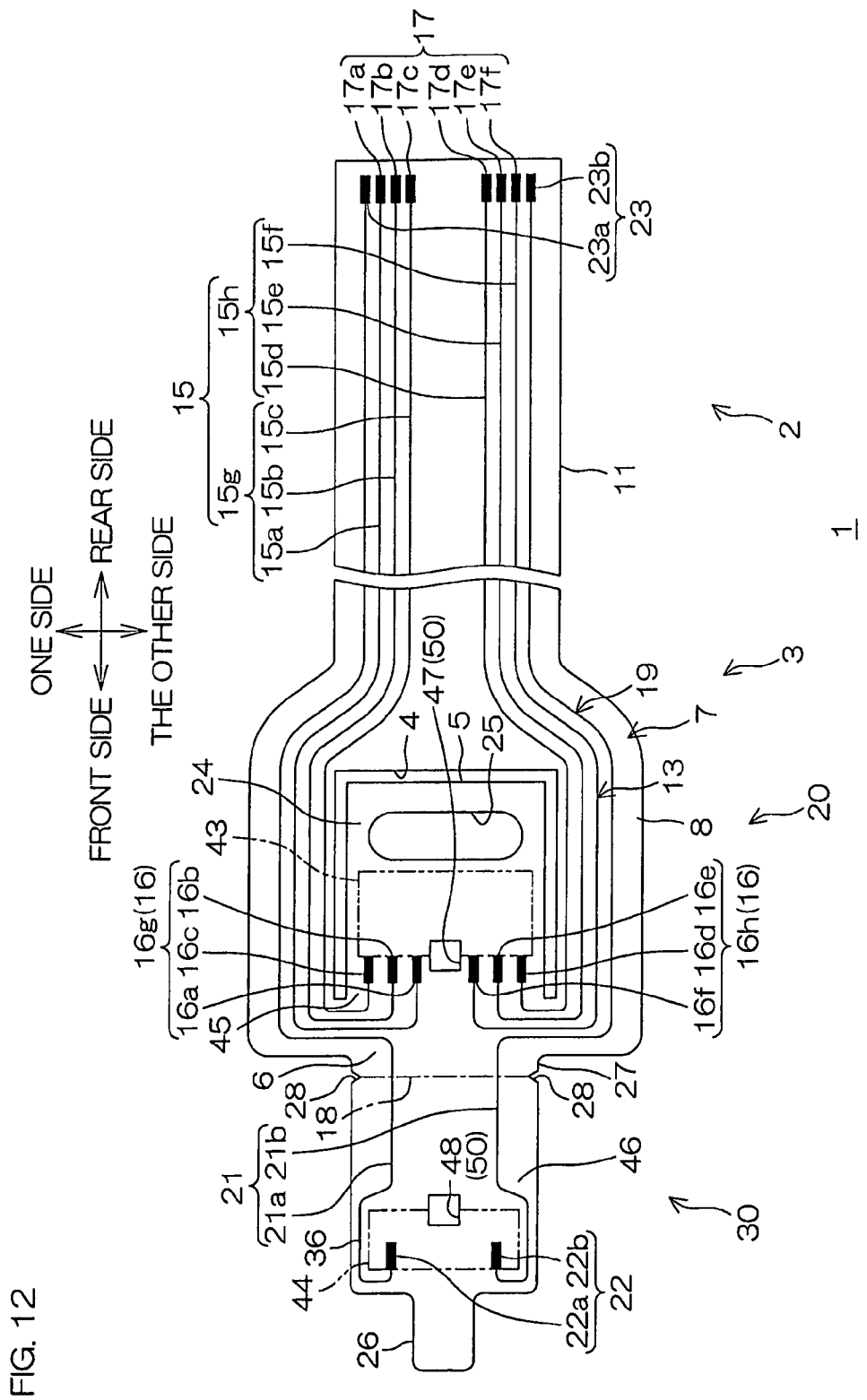
FIG. 12 is a plan view of a suspension board with circuit according to yet another embodiment of the present invention.

FIG. 12 is a plan view of a suspension board with circuit according to yet another embodiment of the present invention.

In the description given above, the element-side terminals 22 are formed on the element-side-terminal formation portion 46. However, as shown in FIG. 12, it is also possible to form the element-side terminals 22 on, e.g., the element mounting region 44.

In FIG. 12, the element-side terminals 22 are arranged in parallel in widthwise spaced-apart relation along the front end edge of the element mounting region 44 of the auxiliary portion 30.

In the auxiliary portion 30, the first power source wire 21a is disposed on one widthwise side of the element mounting region 44 to pass it around toward the front side, and has the front end portion thereof connected to the front end portion of the first element-side terminal 22a. On the other hand, in the auxiliary portion 30, the second power source wire 21b is disposed on the other widthwise side of the auxiliary portion 30 to pass it around toward the front side, and has the front end portion thereof connected to the front end portion of the second element-side terminal 22b.

FIG. 13 is an enlarged plan view of the fold portion of a suspension board with circuit according to still another embodiment of the present invention prior to the folding-back step. FIG. 14 is an enlarged view of the fold portion of the suspension board with circuit according to the still another embodiment of the present invention prior to the folding-back step, (a) showing a plan view thereof, and (b) showing a cross-sectional view thereof along the line E-E of (a).

In the description given above, each of the notched portions 28 is formed in a generally triangular plan view shape. However, the shape of the notched portion 28 is not limited thereto. For example, as shown in FIG. 13, the notched portion 28 can also be formed into an arbitrary shape such as a generally semicircular plan view shape.

In the description given above, the power source wires 21 at the fold portion 18 are supported by the metal supporting board 11. However, as shown in FIG. 14, the power source wires 21 can also be allowed to pass through the fold portion 18 so as not to be supported by the metal supporting board 11.

The fold portion 18 has a folded-back opening 33 formed to extend through the metal supporting board in the thickness direction thereof.

The folded-back opening 33 is formed in a long hole shape elongated in the widthwise direction when viewed in plan view. The folded-back opening 33 is formed midway in the widthwise direction. Specifically, the folded-back opening 33 is formed between the two notched portions 28 to be spaced apart therefrom in the widthwise direction. The folded-back opening 33 is also formed to expose the plurality of power source wires 21.

The power source wires 21 exposed from the folded-back opening 33 are supported by the insulating base layer 12 from therebelow, and supported by the insulating cover layer 14 from thereabove.

By forming the folded-back opening 33, the fold portion 18 can be formed as a fragile portion having a further reduced mechanical strength. Accordingly, the folding-back step can be performed more easily.

Furthermore, the power source wires 21 are supported by the insulating base layer 12 and the insulating cover layer 14 each made of a relatively flexible insulating material (synthetic resin) or the like without being supported by the folded-back opening 33. Therefore, in the folding-back step, the power source wires 21 exposed from the folded-back opening 33 can gently curve by flexibly following the folding of the fold portion 18. As a result, it is possible to effectively prevent breakage of the power source wires 21 resulting from the folding of the fold portion 18.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:
1. A suspension board with circuit comprising:
a conductive pattern;

a board main body portion;

an auxiliary portion formed continuously from the board main body portion, and folded back with respect to the board main body portion so as to face a back surface of the board main body portion;

a slider disposed on a side of the suspension board with circuit which is closer to the board main body portion when viewed in a direction in which the board main body portion and the auxiliary portion face each other, and mounting thereon a magnetic head electrically connected to the conductive pattern; and a light emitting element disposed on a side of the suspension board with circuit which is closer to the auxiliary portion in the direction in which the board main body portion and the auxiliary portion face each other, and electrically connected to the conductive pattern, wherein the conductive pattern includes:

a first conductive pattern including a first terminal electrically connected to an external circuit, and a second terminal electrically connected to the magnetic head; and a second conductive pattern including a third terminal electrically connected to the external circuit, and a fourth terminal electrically connected to the light emitting element, wherein, in the first conductive pattern, both of the first terminal and the second terminal are disposed on the board main body portion, and, in the second conductive pattern, the third terminal is disposed on the board main body portion or on the auxiliary portion, and the fourth terminal is disposed on the auxiliary portion.

2. The suspension board with circuit according to claim 1, wherein the slider and the light emitting element are disposed to face each other in a thickness direction.

3. The suspension board with circuit according to claim 1, wherein
   the slider includes an optical waveguide,
   the light emitting element is disposed on a back surface of the slider so as to face the optical waveguide in a thickness direction, and
   each of the board main body portion and the auxiliary portion is formed with a first opening extending therethrough in the thickness direction thereof so as to allow the light emitting element to be inserted through the first opening.

4. The suspension board with circuit according to claim 1, wherein
   the slider includes an optical waveguide, and
   each of the board main body portion and the auxiliary portion is formed with a second opening extending therethrough in a thickness direction thereof so as to allow light emitted from the light emitting element to pass through the second opening to be incident upon the optical waveguide.

5. The suspension board with circuit according to claim 1, wherein
   the board main body portion is formed with a third opening extending therethrough in a thickness direction, and
   the auxiliary portion includes an insertion portion to be inserted into the third opening.

6. The suspension board with circuit according to claim 1, wherein the board main body portion and the auxiliary portion are joined together by welding.

\* \* \* \* \*